US012750302B2

(12) United States Patent
Gort et al.

(10) Patent No.: US 12,750,302 B2
(45) Date of Patent: *Sep. 29, 2026

(54) FPGA NEIGHBOR OUTPUT MUX DIRECT CONNECTIONS TO MINIMIZE ROUTING HOPS

(71) Applicant: EFINIX, INC., Santa Clara, CA (US)

(72) Inventors: Marcel Gort, Toronto (CA); Brett Grady, Toronto (CA)

(73) Assignee: EFINIX, INC., Santa Clara, CA (US)

( * ) Notice: Subject to any disclaimer, the term of this patent is extended or adjusted under 35 U.S.C. 154(b) by 62 days.

This patent is subject to a terminal disclaimer.

(21) Appl. No.: 18/782,656

(22) Filed: Jul. 24, 2024

(65) Prior Publication Data

US 2024/0380684 A1 Nov. 14, 2024

Related U.S. Application Data

(63) Continuation of application No. 17/650,960, filed on Feb. 14, 2022, now Pat. No. 12,052,160.

(Continued)

(51) Int. Cl.

*H03K 19/17728* (2020.01)
*H03K 19/173* (2006.01)

(Continued)

(52) U.S. Cl.

CPC ....... *H04L 45/122* (2013.01); *H03K 19/1737* (2013.01); *H03K 19/17728* (2013.01); *H04L 45/42* (2013.01)

(58) Field of Classification Search

CPC ......... H03K 19/1737; H03K 19/17724; H03K 19/17728; H03K 19/17736

See application file for complete search history.

(56) References Cited

U.S. PATENT DOCUMENTS 5,689,195 A * 11/1997 Cliff ................. H03K 19/17736 326/39
5,740,069 A * 4/1998 Agrawal ............ H03K 19/1737 716/117

(Continued)

FOREIGN PATENT DOCUMENTS

CN 107925410 A 4/2018

OTHER PUBLICATIONS

Notification to Grant Patent Right for Invention received for Chinese Patent Application No. 202210163187.1, mailed on Jun. 26, 2025, 4 pages (2 pages of English Translation and 2 pages of Original Document).

(Continued)

*Primary Examiner* — Jason M Crawford

(74) *Attorney, Agent, or Firm* — Womble Bond Dickinson (US) LLP

(57) ABSTRACT

Methods and apparatuses to provide FPGA neighbor output mux direct connections to reduce, and potentially minimize, routing hops are described. Embodiments described herein include the addition of direct connections from one tile to the output muxing of a neighboring tile. An FPGA apparatus includes a plurality of logic block tiles. One or more direct connections extend from one or more logic block tiles of the plurality of logic block tiles to one or more inputs of output multiplexors (muxes) of one or more neighboring logic block tiles. The one or more direct connections are configured to drive one or more wires that start at the one or more neighboring logic block tiles.

23 Claims, 7 Drawing Sheets

Related U.S. Application Data

(60) Provisional application No. 63/152,122, filed on Feb. 22, 2021.

(51) Int. Cl.
*H04L 45/122* (2022.01)
*H04L 45/42* (2022.01)

(56) References Cited

U.S. PATENT DOCUMENTS 5,883,525 A * 3/1999 Tavana ............. H03K 19/17796 326/39
6,069,490 A * 5/2000 Ochotta ........... H03K 19/17736 326/39
6,259,272 B1 * 7/2001 Cliff ................. H03K 19/17744 326/39
6,275,064 B1 * 8/2001 Agrawal .......... H03K 19/17796 326/38
6,292,018 B1 * 9/2001 Kean ....................... G06F 30/34 326/39
7,111,215 B1 * 9/2006 Keller .................... G11C 5/063 326/38
7,274,214 B1 9/2007 Young
7,902,864 B1 * 3/2011 Hutton ............. H03K 19/17728 326/38
8,196,081 B1 6/2012 Arslan et al.
9,411,554 B1 * 8/2016 Young ................... G06F 7/5324
9,490,811 B2 * 11/2016 Ngai .............. H03K 19/017581
9,525,419 B2 * 12/2016 Ngai ....................... G06F 30/34
9,543,958 B1 * 1/2017 Wang ............... H03K 19/17724
11,467,804 B2 10/2022 Gribok et al.
12,052,160 B2 * 7/2024 Gort ................... H03K 19/1737
2008/0074142 A1 * 3/2008 Henderson ....... H03K 19/17736 326/41
2019/0324724 A1 * 10/2019 Gribok .................. G06F 30/347
2022/0247412 A1 * 8/2022 Gort ................... H03K 19/1735
2022/0271754 A1 * 8/2022 Gort ................. H03K 19/17728
2022/0272026 A1 * 8/2022 Gort ...................... H04L 45/122
2024/0007109 A1 * 1/2024 Gort ................. H03K 19/17728
2024/0380684 A1 * 11/2024 Gort ................. H03K 19/17728

OTHER PUBLICATIONS

Notice of Allowance received for U.S. Appl. No. 17/650,960, mailed on Apr. 15, 2024, 11 pages.
Notice of Allowance received for U.S. Appl. No. 17/650,960, mailed on Apr. 26, 2024, 5 pages.
CN Office Action, including Search Report received for Chinese Patent Application No. 202210163187.1, mailed on Oct. 31, 2024, 10 pages.

* cited by examiner

400

FPGA Direct Output Mux connections

600

FPGA NEIGHBOR OUTPUT MUX DIRECT CONNECTIONS TO MINIMIZE ROUTING HOPS

CROSS-REFERENCE TO RELATED APPLICATIONS

This application is a continuation application of co-pending U.S. patent application Ser. No. 17/650,960 entitled "FPGA NEIGHBOR OUTPUT MUX DIRECT CONNECTIONS TO MINIMIZE ROUTING HOPS" filed on Feb. 14, 2022 that claims the benefit of U.S. provisional patent application No. 63/152,122, entitled "FPGA NEIGHBOR OUTPUT MUX DIRECT CONNECTIONS TO MINIMIZE ROUTING HOPS" filed on Feb. 22, 2021, which are incorporated herein by reference in their entirety.

FIELD

Embodiments as described herein relate to a field of programmable gate architectures, and in particular, to programmable gate architectures with neighbor output mux direct connections to minimize routing hops.

BACKGROUND

Field Programmable Gate Arrays (FPGAs) are built using repeated tiles, each of which implements some logic and is connected to some wires, which are driven at that tile. Each logic block can make connections to other logic blocks by using any of the starting wires that start at that logic block and any wires connected to the starting wires.

An FPGA architect chooses wire segment lengths to optimize for speed, area, and routing flexibility. Wires typically drive other wires only at their end points while they drive some of the logic blocks along their length (not just at their end point). When wire segment length is chosen so that it spans only one tile, then that wire segment can be used to start a combination of wires that can access any logic block on the chip. However, going longer distances requires traversing many wires and many multiplexors (muxes), which is slow.

Longer wire segment lengths can be used to reduce muxing area and increase speed, at the cost of routing flexibility. A routing network consisting entirely of wire segments that span 2 tiles would make every second logic block inaccessible. For that reason, some combination of different wire segments are used, and connections between these wire segment lengths allow each tile to be accessible by every other tile.

For existing techniques, even when a mix of wire segments are used, the number of hops that is required to get from one tile to any other tile is variable, and does not increase monotonically with distance between tiles. The wire segment mix means that some tiles can be accessed very directly (e.g. straight up 10 tiles when length 10 wires are used) or very indirectly (e.g. up 9 and over 1 when a mix of length 10 and length 1 wire segment are used). For existing techniques, it is difficult for a software to map a design onto an FPGA while meeting setup constraints.

SUMMARY

Methods and apparatuses to provide FPGA neighbor output mux direct connections to minimize routing hops are described. Embodiments described herein include the addition of direct connections from one tile to the output muxing of a neighboring tile. In at least some embodiments, an FPGA apparatus includes a plurality of logic block tiles. One or more direct connections extend from one or more logic block tiles of the plurality of logic block tiles to one or more inputs of output multiplexors (muxes) of one or more neighboring logic block tiles. The one or more direct connections are configured to drive one or more wires that start at the one or more neighboring logic block tiles.

In at least some embodiments, an apparatus comprises a memory; and a processor coupled to the memory. The processor is configured to determine one or more logic block tiles of a plurality of FPGA logic block tiles, determine one or more neighboring logic block tiles of the plurality of FPGA logic block tiles, and directly connect the one or more logic block tiles to one or more inputs of output multiplexors (muxes) of the one or more neighboring logic block tiles to drive one or more wires that start at the one or more neighboring logic block tiles.

In at least some embodiments, a non-transitory machine readable medium is provided. The non-transitory machine readable medium stores instructions that cause a data processing system to perform operations comprising determine one or more logic block tiles of a plurality of FPGA logic block tiles, determine one or more neighboring logic block tiles of the plurality of FPGA logic block tiles, and directly connect the one or more logic block tiles to one or more inputs of output multiplexors (muxes) of the one or more neighboring logic block tiles to drive one or more wires that start at the one or more neighboring logic block tiles.

Other apparatuses, methods, and machine-readable mediums to provide FPGA neighbor output mux direct connections are also described.

BRIEF DESCRIPTION OF THE DRAWINGS

Embodiments of the application may best be understood by referring to the following description and accompanying drawings that are used to illustrate embodiments of the application. In the drawings.

DETAILED DESCRIPTION

Figure 1:
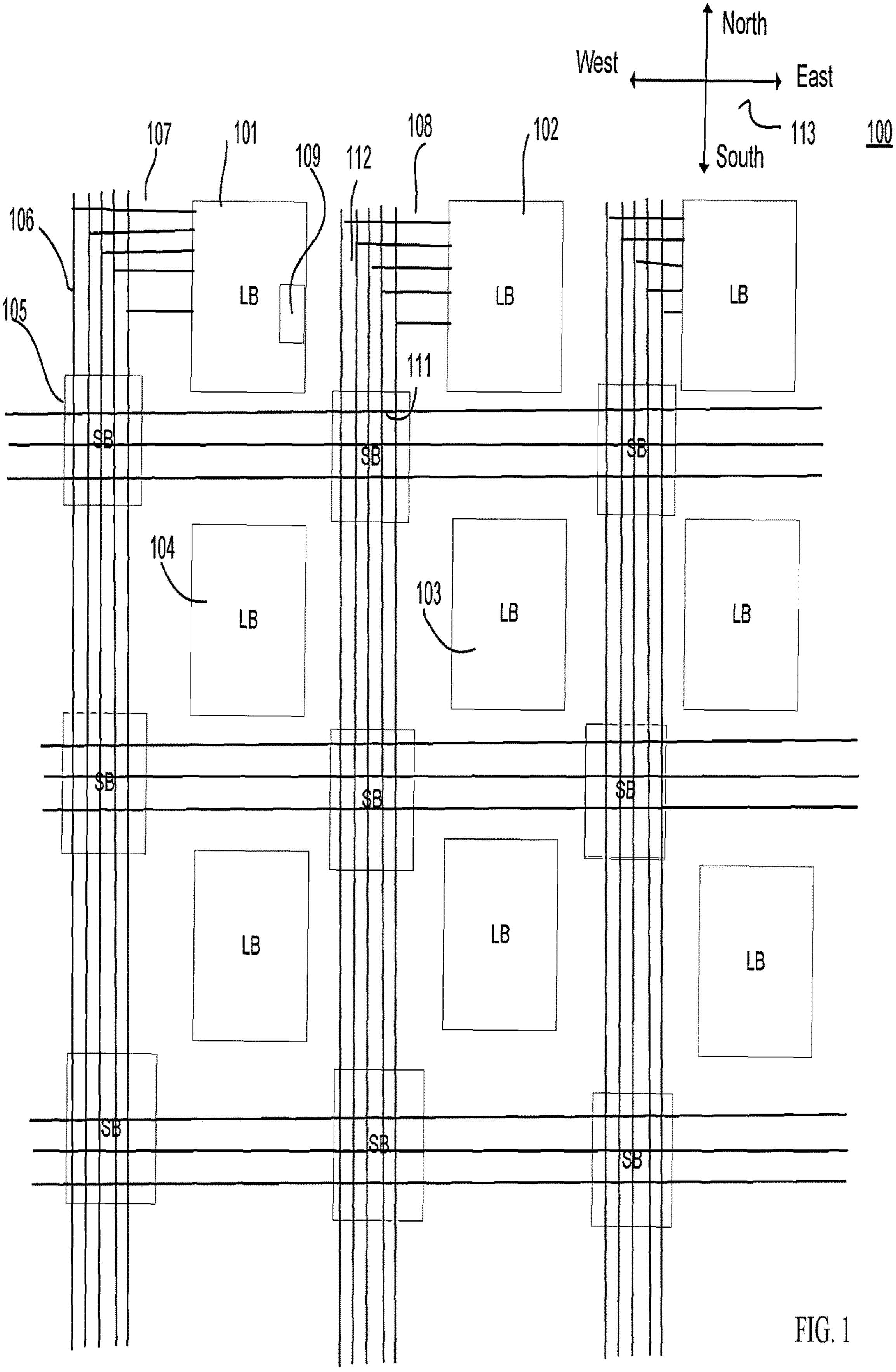
FIG. 1 is a view 100 of a field programmable gate array (FPGA) system architecture according to one embodiment of the disclosure.

Methods and apparatuses to provide FPGA neighbor output mux direct connections to minimize routing hops are described. Embodiments described herein include the addition of direct connections from one tile to the output muxing of a neighboring tile. Direct connections from an FPGA logic block to the output muxes of neighboring FPGA logic blocks are added to increase flexibility, area efficiency, and speed of a FPGA routing network comparing to conventional techniques.

In at least some embodiments, a source tile has access to the starting wires that start at a neighboring tile. This creates a much smoother function of the number of routing hops versus the distance between two routing tiles comparing to existing techniques. Additionally, the software that maps designs onto the FPGA has more options when trying to place two logic blocks nearby with as few hops as possible between them. Smoothing a function of the number of hops versus distance makes it easier for software to map a design onto an FPGA while meeting setup constraints. Additionally, increasing the number of tiles that are accessible with few hops helps software satisfy setup constraints on multiple paths simultaneously.

In at least some embodiments, an FPGA apparatus includes a plurality of logic block tiles including one or more first logic block tiles and one or more second logic block tiles. One or more wires start at the one or more first logic block tiles. One or more direct connections extend from the one or more first logic block tiles to one or more inputs of output multiplexors (muxes) of one or more second logic block tiles that are neighboring logic block tiles to the one or more first logic block tiles. The one or more direct connections are configured to drive one or more wires that start at the one or more second logic block tiles, as described in further detail below.

In at least some embodiments, the direct output mux connections are made to any number of neighboring tiles. Increasing a number of direct connections smoothens a function of hops versus a distance at the cost of increasing the size of muxes in neighboring tiles. In one embodiment, the decision of how many direct connections and which neighbors to add them to is tied to the FPGA logic block architecture and the wire segment architecture. An FPGA architect can also decide where to connect the direct connections within the neighboring tile. In at least some embodiments, for logic blocks that have multiple stages of output muxing, direct connections can be made to earlier mux stages or later mux stages, which is a trade-off that is tied to the FPGA logic block architecture and wire segment architecture.

In at least some embodiments, introducing direct output mux connections improves operating frequency of a typical circuit implemented on an FPGA. Additionally, less flexible wire segment architectures can be chosen due to the additional flexibility introduced by the addition of output mux direct connections, as described in further detail below.

Various embodiments and aspects of the disclosure will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

FIG. 1 is a view 100 of a field programmable gate array (FPGA) system architecture according to one embodiment. The FPGA system includes a plurality of FPGA tiles, such as, for example, FPGA tiles 101, 102, 103, 104, 105 and 111. In some embodiments, FPGA tiles 101, 102, 103 and 104 are logic blocks (LBs) and tiles 105 and 111 are switch blocks (SBs). The tiles are connected using wires. As shown in FIG. 1, tile 101 is connected to wires of a routing track 106 by wires 107. The wires of the routing track 106 pass through tile 105. Tile 102 is connected to wires of a routing track 112 by wires 108. The wires of the routing track pass through tile 111.

In at least some embodiments, LB tile 101 includes one or more direct connections 109 to one or more inputs of output muxes of one or more other LB tiles. In at least some embodiments, the other LB tiles are neighboring LB tiles to tile 101, e.g., LB tiles 102, 103 and 104. Generally, a tile A is said to be a neighboring tile to a tile B if it is physically adjacent to tile B. A horizontal neighbor tile A is one in which tile A is either directly east or west of tile B with no other tiles between tile A and B. A diagonal tile A is one in which tile A is either directly north-east, north-west, south-east, or south-west of tile B, with no other tiles between A and B. A vertical neighbor tile A is one in which tile A is either directly north or south of tile B with no other tiles between tile A and B. A diagram 113 represents north, south, east and west directions on an FPGA architecture map. As shown in FIG. 1, tile 102 is directly east of tile 101, tile 103 is directly south-east of tile 101, and tile 104 is directly south of tile 101.

In at least some embodiments, one or more direct connections 109 includes one or more wires (not shown). In at least some embodiments, the one or more of direct connections 109 are configured to drive one or more wires (not shown) that start at the one or more other LB tiles. In at least some embodiments, LB tile 101 includes a LB having one or more output muxes (not shown) and a neighboring logic block tile includes a logic block having one or more output muxes, and an output of the one or more output muxes of the LB tile 101 is directly connected to an input of one or more output muxes of the neighboring LB tile. In at least some embodiments, one or more direct connections 109 comprise one or more wires. In at least some embodiments, the one or more direct connections 109 comprises a direct connection from an output of a look up table (LUT) of the LB tile 101 to an input of the one or more inputs of output muxes of the one or more neighboring logic block tiles. In at least some embodiments, one or more direct connections 109 is a horizontal connection to a LB tile 102 that is at the same row as the tile 101. In at least some embodiments, one or more direct connections 109 is a vertical connection to a tile 104 that is at the same column as the tile 101. In at least some embodiments, the one or more direct connections, such as, for example, direct connections 109, is a diagonal connection to a tile 103 that is at neighboring column and at a neighboring row to the tile 101. In at least some embodiments, the other LB tiles (102, 103, or 104) to which one or more direct connections 109 are provided from LB tile 101, are determined based on one or both of a time and a frequency of the design of the circuit. In at least some embodiments, a number (amount) of the one or more direct connections 109 is determined based on a circuit design constraint. In at least some embodiments, the amount of the one or more direct connections 109 increases to increase reachability, reduce timing delays and increase speed of the signal and circuit performance. In at least some embodiments, the other LB tiles (102, 103, or 104) to which one or more direct connections 109 are provided from LB tile 101, are determined based on a trade-off between the negative impact to chip area and mux speed vs. the improvement in routing flexibility that can results in an improvement in wire usage and circuit frequency of designs implemented on the FPGA.

Generally, the routing architecture comprises programmable switches and wires. Routing provides connection between input/output (I/O) blocks and logic blocks, and between one logic block and another logic block. The type of routing architecture determines the area consumed by routing and the density of logic blocks. A routing technique used in an FPGA may determine the amount of area used by wire segments and programmable switches as compared to area consumed by logic blocks. A wire segment may refer to two end points of an interconnect with no programmable switch between them. A sequence of one or more wire segments in an FPGA can be termed as a track. Typically an FPGA has logic blocks, interconnects and I/O blocks. I/O blocks lie in the periphery of logic blocks and interconnect. Wire segments connect I/O blocks to wire segments through connection blocks. Connection blocks are connected to logic blocks, depending on the design requirement one logic block is connected to another and so on.

Generally, an FPGA architecture includes wires with start points (where they are driven by a mux) and end point (the location of the furthest mux input that is driven by this wire). For example, a wire that is driven by a mux logically located at grid location (4,5) and that drives a different mux at location (4, 10) would have a length of 5. Typically, a multitude of different wire types exists on an FPGA, each with a different length. For example, an FPGA could have three different wire types, one of which has length 1, one of which has length 5, and one of which has length 14. In at least some other embodiments, the FPGA architecture has one or more of length 1 wires, length 2 wires, length 3 wires, length 4 wires, length 5 wires, other length wires, or any combination thereof.

Figure 2:
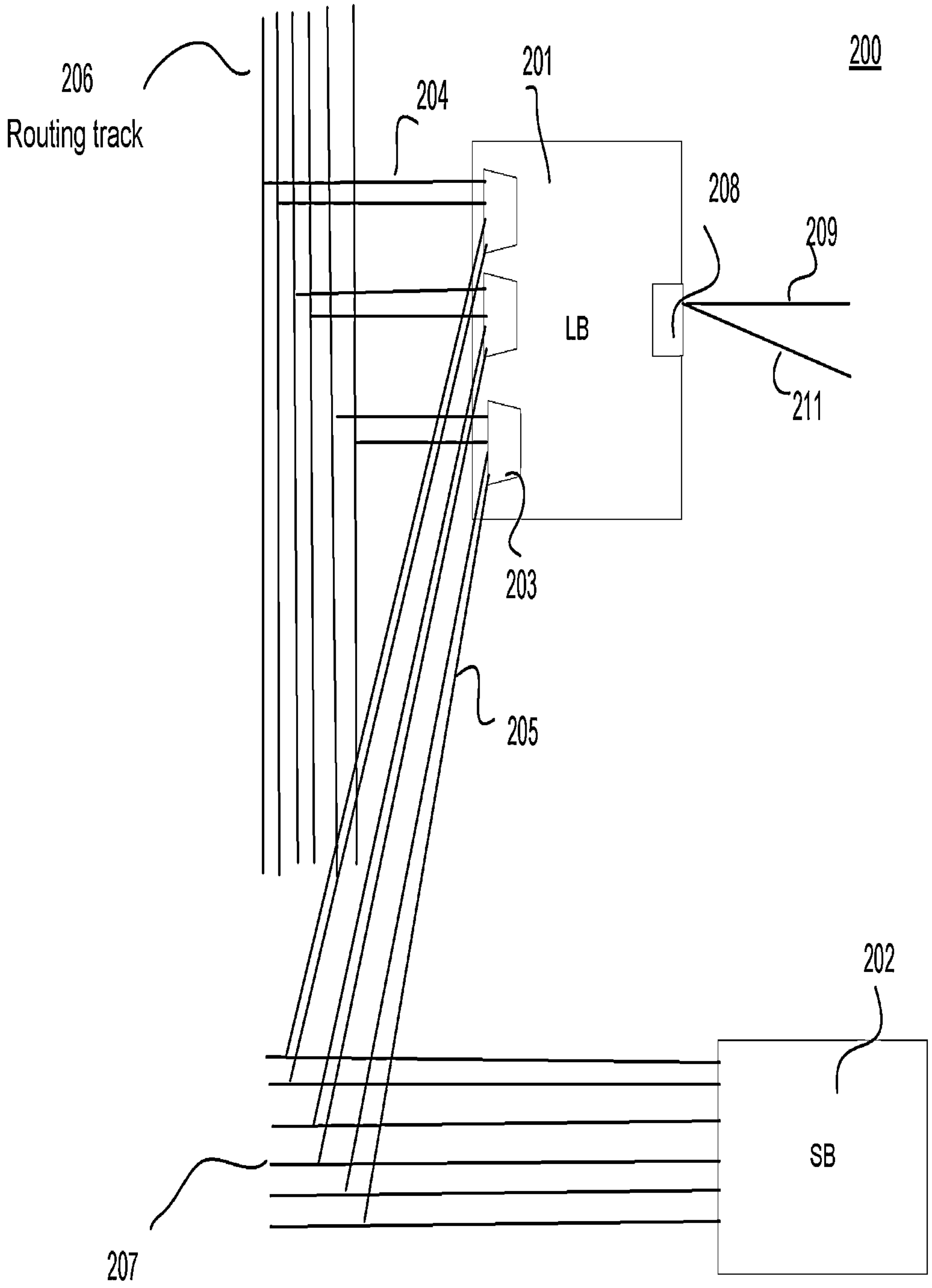
FIG. 2 is a view 200 of a portion of a field programmable gate array (FPGA) system architecture according to one embodiment of the disclosure.

FIG. 2 is a view 200 of a portion of a field programmable gate array (FPGA) system architecture according to one embodiment. The view 200 shows a LB tile 201, a SB tile 202, a routing track 206 and a routing track 207. LB tile 201 includes input muxes, such as an input mux 203. In at least some embodiments, LB tile 201, SB tile 202, routing track 206 and routing track 207 represent the routing tracks and tiles of the FPGA system, as described above with respect to FIG. 1. As shown in FIG. 2, the input muxes of LB tile 201 are connected to the wires of routing track 206 using wires 204. The input muxes of LB tile 201 are connected to the wires of the routing track 207 using wires 205. The routing track 207 is connected to SB tile 202. Each of wires 204 and 205 drives a separate input of the mux 203, as shown in FIG. 2.

As shown in FIG. 2, LB tile 201 includes one or more direct connections 208 to one or more inputs of output muxes of neighboring LB tiles (not shown). In at least some embodiments, one or more direct connections 208 include one or more output muxes (not shown). In at least some embodiments, an output of the one or more output muxes of LB tile 201 is directly connected to an input of the one or more output muxes of a neighboring LB tile using a wire. In at least some embodiments, one or more direct connections 208 includes a wire 211 to directly connect to an input of the mux of a neighboring LB tile (not shown) and a wire 209 to drive other LB tiles. In at least some embodiments, a signal on wire 211 is the same as the signal on the wire 209. In at least some embodiments, one or more direct connections 208 includes a direct connection from an output of a look up table (LUT) of the tile 101 to an input of the one or more inputs of output muxes of the one or more neighboring logic block tiles, as described in further detail below.

Figure 3:
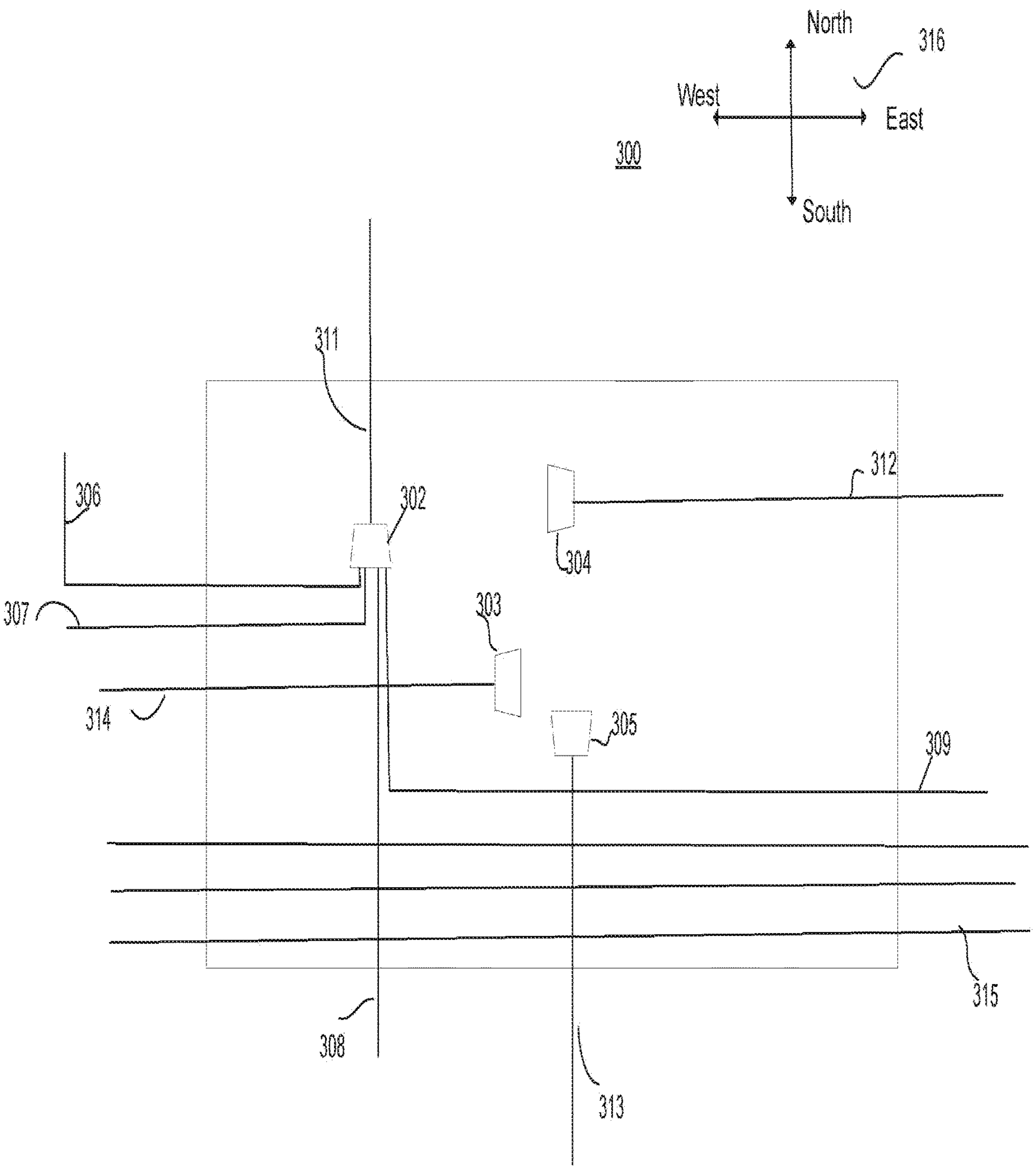
FIG. 3 is a view of a switch block (SB) 300 according to one embodiment of the disclosure.

FIG. 3 is a view of a switch block (SB) 300 according to one embodiment. A diagram 316 represents north, south, east and west directions on an FPGA architecture map. Wires that end at the SB 300 can drive one or more muxes in the SB 300 that drive one or more wires that start at that location. Additionally, a logic block that is co-located with the switch block can drive one or more muxes in the SB. As shown in FIG. 3, the SB includes a plurality of multiplexors (muxes) 302, 303, 304 and 305. Each of muxes 302, 303, 304 and 305 has a plurality of inputs and an output. In some embodiments, each of muxes 302, 303, 304 and 305 is driven by one or more wires that end at and are coupled to an input of that mux. As shown in FIG. 3, a logic block wire 306, an east wire 307, a north wire 308, a west wire 309 end at the SB 300. Each of a logic block wire 306, an east wire 307, a north wire 308, a west wire 309 ends at a corresponding input of mux 302. In some embodiments, each wire that starts at the SB 300 is driven by a mux. As shown in FIG. 3, the mux 302 drives a north wire 311 that starts at the output of the mux 302. The mux 303 drives an east wire 314 that starts at the output of the mux 303. The mux 304 drives a west wire 312 that starts at the output of the mux 304. The mux 305 drives a south wire 313 that starts at the output of the mux 305. As shown in FIG. 3, one or more wires 315 pass through the SB. One or more wires 315 bypass the muxes in the SB 300.

Figure 4:
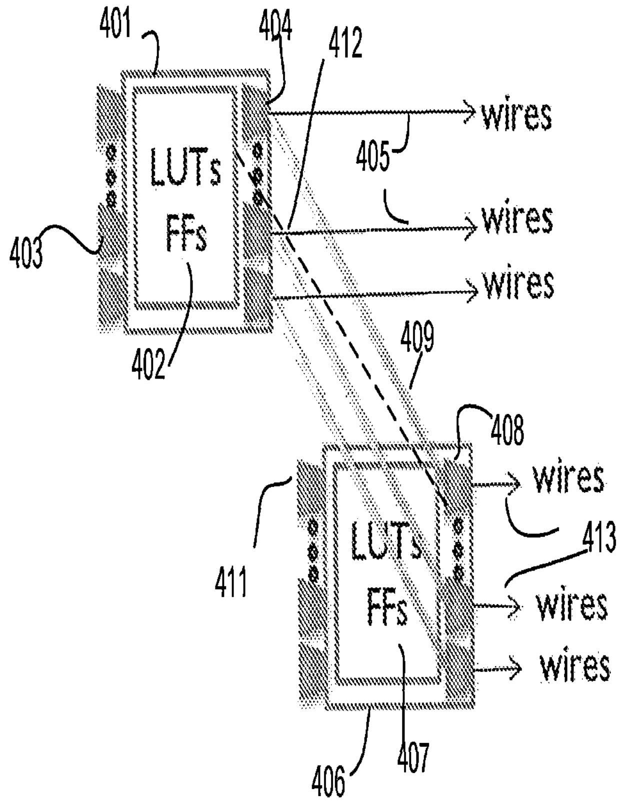
FIG. 4 is a view of an apparatus 400 including FPGA direct neighbor output mux connections according to one embodiment of the disclosure.

FIG. 4 is a view of an apparatus 400 including FPGA direct neighbor output mux connections according to one embodiment. The apparatus 400 includes a plurality of FPGA logic block tiles, such as a tile 401 and a tile 406. In at least some embodiments, tile 406 is a neighboring tile to the tile 401. The tile 401 includes a logic block 402 and tile 406 includes a logic block 407. In some embodiments, each of the logic blocks 402 and 407 includes one or more look up tables (LUTs) and flip flops (FFs). The tile 401 includes input muxes, such as, for example, an input mux 403 and output muxes, such a, for example, an output mux 404. The output muxes of tile 401 drive wires 405 to other FPGA logic block tiles. The tile 406 includes input muxes, such as, for example, an input mux 411 and output muxes, such as, for example, an output mux 408. The output muxes of the tile 406 drive wires 413.

As shown in FIG. 4, wires 405 start at logic block tile 401 and wires 413 start at logic block tile 406. In at least some embodiments, the input muxes 403 and 411 represent the input muxes, as described above with respect to FIG. 2. In at least some embodiments, output muxes 404 and 408 represent the output muxes as described above with respect to FIG. 2. One or more direct connections, e.g., a connection 409, a connection 412 are generated from the FPGA logic block tile 401 to one or more inputs of output muxes 408. In at least some embodiments, the connection 409 is added to an output of mux 404 that drives a wire 405. As shown in FIG. 4, wire 405 and wire 409 are connected to the output of mux 404. The connection 409 is a direct connection from the output of mux 404 to an input of output mux 408 to drive wire 413. In at least some embodiments, the connection 412 is a direct connection from an output of a LUT of the logic block 402 to an input of output mux 408 to drive wire 413. In at least some embodiments, direct connection 409 comprises a wire. In at least some embodiments, direct connection 412 comprises a wire. In at least some embodiments, wherein direct connection 409 carries a signal that is the same as the signal on the wire 405 that drives another logic block tile, so that output mux resources are shared between different logic blocks. In at least some embodiments, a logic cell has the ability to directly drive the wires that start at neighboring cells. For example, the driver of a wire is a mux with a number of inputs, and at least some of the inputs of that mux are directly connected to one or more neighboring logic cells. For another example, a FPGA logic cell has output muxes that drive the wires that started at that location. Direct connections are added from these output muxes to the inputs of muxes of the neighboring cells to drive the wires that start at the neighboring cells. This way, the circuit is able to directly drive with just one extra mux other wires that start at different locations, so that a time delay of the circuit is greatly reduced.

Generally, mapping, e.g., placing, routing, a circuit design onto the FPGA needs to satisfy predetermined design constraints. In at least some embodiments, the logic block tiles to which the direct connections, such as direct connection 409, direct connection 412 are provided, are determined based on circuit design constraints, e.g., a time, a frequency, or both the time and the frequency. In at least some embodiments, a number of direct connections, e.g., how many direct connections 409, 412 need to be generated, is determined based on a length of a FPGA wire segment used for routing a circuit. In at least some embodiments, a number of the one or more direct connections 409, 412 is increased to increase reachability, reduce timing delays and increase speed of the signal and circuit performance. As shown in FIG. 4, connections are made from the outputs of a logic block to the inputs of the output muxing of a neighboring logic block. As shown in FIG. 4, each logic block also connects to wires, the lengths of which are defined by the FPGA wire segment architecture. This has the effect of sharing output mux resources between different logic blocks.

Figure 5:
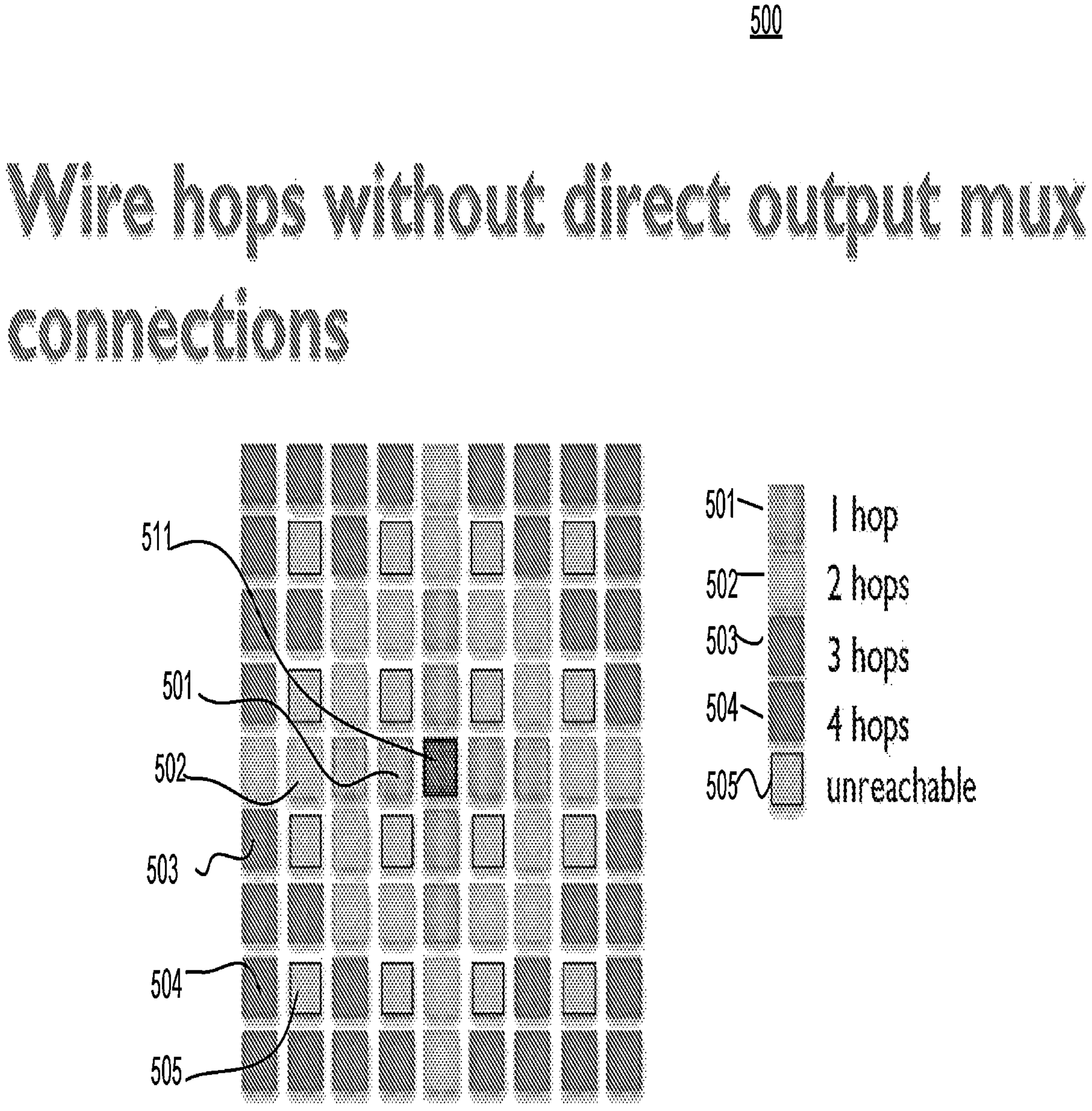
FIG. 5 is a map 500 representing an FGPA architecture without direct output mux connections according to one embodiment of the disclosure.

FIG. 5 is a map 500 representing an FGPA architecture without direct output mux connections according to one embodiment of the disclosure. Map 500 illustrates a number of wire hops that needs to be used to reach logic blocks without neighbor output mux direct connections. As shown in FIG. 5, the FPGA architecture includes 81 tiles. The map view 500 shows an amount of hops (e.g., wire segments) needed to reach each FPGA tile from a source FPGA tile 511 in the center of the 9 tiles×9 tiles grid. The map illustrates how much delay (hops) is needed to get from one location to every other location on the chip. For this example, the FPGA wire segment architecture has length 2 wires.

As shown in FIG. 5, 8 FPGA tiles, such as an FPGA tile 501 are reachable with one hop (one length 2 wire) from an FPGA tile 511. As shown in FIG. 5, 20 FPGA tiles, such as an FPGA tile 502, are reachable with two hops (two length 2 wires) from an FPGA tile 511. As shown in FIG. 5, 24 FPGA tiles, such as an FPGA tile 503, are reachable with three hops (three length 2 wires) from an FPGA tile 511. As shown in FIG. 5, 12 FPGA tiles, such as an FPGA tile 504, are reachable with four hops (four length 2 wires) from an FPGA tile 511. As shown in FIG. 5, 16 FPGA tiles, such as an FPGA tile 505, are unreachable from an FPGA tile 511. That is, without direct output mux connections, some locations on the map 500 are not reachable with length 2 wires.

Figure 6:
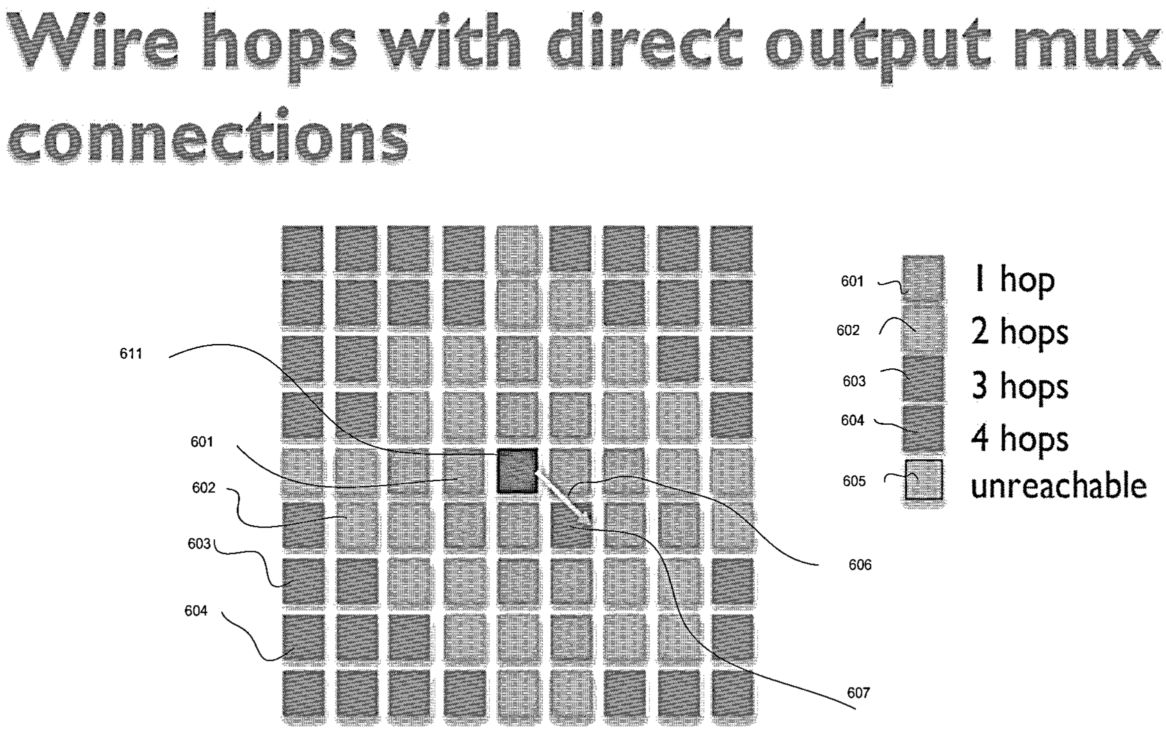
FIG. 6 is a map 600 representing an FGPA architecture with direct output mux connections according to one embodiment of the disclosure.

FIG. 6 is a map 600 representing an FGPA architecture with direct output mux connections according to one embodiment of the disclosure. The map 600 illustrates a number of wire hops that needs to be used to reach logic blocks with neighbor output mux direct connections. The map 600 is different from map 500 in that a direct connection 606 is added between a source FPGA tile 611 in the center of the grid and an FPGA tile 607 to the south/east of the FPGA tile 611. The direct connection 606 drives an output mux of the FPGA tile 607. As shown in FIG. 6, 14 FPGA tiles, such as, for example, an FPGA tile 601, are reachable with one hop from an FPGA tile 611. As shown in FIG. 6, 28 FPGA tiles, such as, for example, an FPGA tile 602, are reachable with two hops from an FPGA tile 611. As shown in FIG. 6, 28 FPGA tiles, such as, for example, an FPGA tile 603, are reachable with three hops from an FPGA tile 611. As shown in FIG. 6, 12 FPGA tiles, such as, for example, an FPGA tile 604, are reachable with four hops from an FPGA tile 611. Note that the number of wire segments that are necessary to reach each of the other tiles on the FPGA has diminished or stayed the same. Additionally, all logic blocks are now reachable. There are no unreachable tiles 605 from the FPGA tile 611 in the map 600. The map 600 is smoother than map 500 as there are fewer discontinuities in the function of routing hops versus distance. The direct output mux connection from a source logic block tile to a neighboring logic tile smooths out the hop (delay) map comparing to conventional techniques. The direct output mux connection from a source logic block tile to a neighboring logic simplifies placing and routing the wires, provides more flexibility and resolves timing and frequency constraints in the FPGA circuit comparing to conventional techniques.

Figure 7:
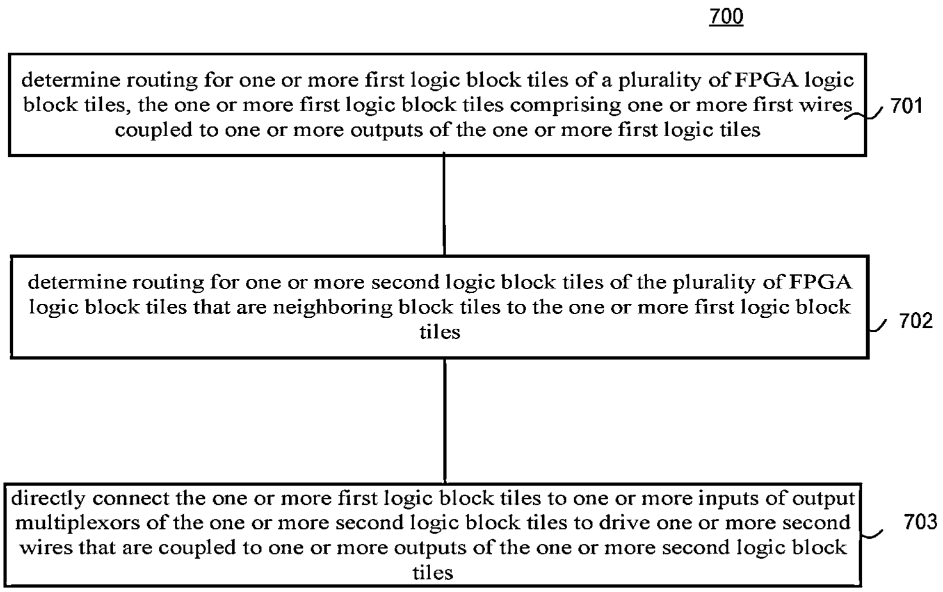
FIG. 7 is a flowchart of a method 700 to provide FPGA neighbor output mux direct connections to minimize routing hops according to one embodiment of the disclosure.

FIG. 7 is a flowchart of a method 700 to provide FPGA neighbor output mux direct connections to reduce, and potentially minimize, routing hops according to one embodiment of the disclosure. Method 700 starts at operation 701 that involves determining routing for one or more first logic block tiles of a plurality of FPGA logic block tiles, the one or more first logic block tiles comprising one or more first wires that start and are coupled to one or more outputs of the one or more first logic block tiles, as described above. In at least some embodiments, the one or more first logic block tiles are source logic block tiles. Operation 702 involves determining routing for one or more second logic block tiles of the plurality of FPGA logic block tiles that are neighboring block tiles to the one or more first logic block tiles, as described above. In at least some embodiments, the one or more second logic block tiles are sink logic block tiles. At operation 703 the one or more outputs of the one or more first logic block tiles are directly connected to one or more inputs of output multiplexors of the one or more second logic block tiles to drive one or more second wires that start and are coupled to one or more outputs of the one or more second logic block tiles, as described above. In at least some embodiments, the one or more first logic block tiles includes a first logic block having one or more first output muxes and the one or more second logic block tiles includes a second logic block having one or more second output muxes, wherein an output of the one or more first output muxes is directly connected to an input of the one or more second output muxes, as described above. In at least some embodiments, an output of a look up table (LUT) of at least one of the one or more first logic block tiles is directly connected to an input of the one or more inputs of output muxes of the one or more second logic block tiles, as described above. In at least some embodiments, the one or more first logic block tiles are directly connected to one or more inputs of output muxes of the one or more second logic block tiles using one or more wires, as described above.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the required method operations. The required structure for a variety of these systems will appear from the description herein. In addition, embodiments of the disclosure are not described with reference to any particular programming language. It will be appreciated that a variety of programming languages may be used to implement the teachings of the embodiments as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. A field programmable gate array (FPGA) apparatus comprising:

a plurality of logic block tiles including one or more first logic block tiles and one or more second logic block tiles, wherein one or more first wires are coupled to one or more outputs of the one or more first logic block tiles; and one or more additional connections extending from the one or more outputs of the one or more first logic block tiles to the one or more second logic block tiles, wherein the one or more second logic block tiles are neighboring logic block tiles to the one or more first logic block tiles, and wherein the one or more additional connections are added to the one or more outputs of the one or more first logic block tiles to drive one or more second wires that start at one or more outputs of the one or more second logic block tiles, wherein the one or more additional connections comprise one or more third wires.

2. The apparatus of claim 1 wherein the one or more first logic block tiles includes a first logic block having one or more first output muxes and the one or more second logic block tiles includes a second logic block having one or more second output muxes, wherein an output of the one or more first output muxes is additionally connected to an input of the one or more second output muxes.

3. The apparatus of claim 1, wherein the one or more additional connections comprises a direct connection from an output of a look up table (LUT) of at least one of the one or more first logic block tiles to an input of the one or more inputs of output muxes of the one or more second logic block tiles.

4. The apparatus of claim 1, wherein the one or more additional connections is at least one of a horizontal connection, a vertical connection, or a diagonal connection.

5. The apparatus of claim 1, wherein the one or more additional connections carry a signal that is the signal on the one or more first wires.

6. The apparatus of claim 1, wherein the one or more second logic block tiles are determined based on one or more of a time and a frequency.

7. The apparatus of claim 1, wherein a number of the one or more additional connections is determined based on a design constraint.

8. An apparatus, comprising:

a memory; and a processor coupled to the memory, wherein the processor is configured to:

determine routing for one or more first logic block tiles of a plurality of FPGA logic block tiles, wherein one or more first wires are coupled to one or more outputs of the one or more first logic block tiles;

determine routing for one or more second logic block tiles of the plurality of FPGA logic block tiles that are neighboring block tiles to the one or more first logic block tiles; and additionally connect the one or more outputs of the one or more first logic block tiles to the one or more second logic block tiles to drive one or more second wires that start at one or more outputs of the one or more second logic block tiles, wherein the processor is further configured to additionally connect the one or more outputs of the one or more first logic block tiles to one or more inputs of output multiplexors (muxes) of the one or more second logic block tiles using one or more third wires.

9. The apparatus of claim 8, wherein the one or more first logic block tiles includes a first logic block having one or more first output muxes and the one or more second logic block tiles includes a second logic block having one or more second output muxes, wherein the processor is further configured to additionally connect an output of the one or more first output muxes to an input of the one or more second output muxes.

10. The apparatus of claim 9, wherein the processor is further configured to additionally connect an output of a look up table (LUT) of at least one of the one or more first logic block tiles to an input of the one or more inputs of output muxes of the one or more second logic block tiles.

11. The apparatus of claim 9, wherein the one or more additional connections is at least one of a horizontal connection, a vertical connection, or a diagonal connection.

12. The apparatus of claim 9, wherein the one or more additional connections carry a signal that is the signal on the one or more first wires.

13. The apparatus of claim 9, wherein the processor is further configured to determine one or more second logic block tiles based on one or more of a time and a frequency.

14. The apparatus of claim 9, wherein the processor is further configured to determine a number of the one or more additional connections based on a design constraint.

15. The apparatus of claim 9, wherein the processor is further configured to increase a number of the one or more additional connections to increase a signal reachability.

16. A non-transitory machine readable medium storing instructions that cause a data processing system to perform operations comprising:

determining routing for one or more first logic block tiles of a plurality of FPGA logic block tiles, wherein one or more first wires are coupled to one or more outputs of the one or more first logic block tiles;

determining routing for one or more second logic block tiles of the plurality of FPGA logic block tiles that are neighboring block tiles to the one or more first logic block tiles, and additionally connecting the one or more outputs of the one or more first logic block tiles to the one or more second logic block tiles to drive one or more second wires that start at one or more outputs of the one or more second logic block tiles, wherein the instructions further cause the data processing system to perform operations comprising:

additionally connecting the one or more outputs of the one or more first logic block tiles to one or more inputs of output muxes of the one or more second logic block tiles using one or more third wires.

17. The non-transitory machine readable medium of claim 16, wherein the one or more first logic block tiles includes a first logic block having one or more first output muxes and the one or more second logic block tiles includes a second logic block having one or more second output muxes, wherein the processor is further configured to additionally connect an output of the one or more first output muxes to an input of the one or more second output muxes.

18. The non-transitory machine readable medium of claim 16, wherein the instructions further cause the data processing system to perform operations comprising:

additionally connecting an output of a look up table (LUT) of at least one of the one or more first logic block tiles to an input of the one or more inputs of output muxes of the one or more second logic block tiles.

19. The non-transitory machine readable medium of claim 16, wherein the one or more additional connections is at least one of a horizontal connection, a vertical connection, or a diagonal connection.

20. The non-transitory machine readable medium of claim 16, wherein the one or more additional connections carry a signal that is the signal on the one or more first wires.

21. The non-transitory machine readable medium of claim 16, wherein the instructions further cause the data processing system to perform operations comprising:

determining one or more second logic block tiles based on one or more of a time, and a frequency.

22. The non-transitory machine readable medium of claim 16, wherein the instructions further cause the data processing system to perform operations comprising:

determining a number of the one or more additional connections based on a design constraint.

23. The non-transitory machine readable medium of claim 16, wherein the instructions further cause the data processing system to perform operations comprising:

increasing a number of the one or more additional connections to increase a signal reachability.

* * * * *